United States Patent [19]
Henninger

[11] Patent Number: 4,560,584
[45] Date of Patent: Dec. 24, 1985

[54] METHOD AND APPARATUS FOR APPLYING SOLDER MASKING TO A CIRCUIT BOARD

[75] Inventor: Albert S. Henninger, Castle Creek, N.Y.

[73] Assignee: Universal Instruments Corporation, Binghamton, N.Y.

[21] Appl. No.: 564,829

[22] Filed: Dec. 23, 1983

[51] Int. Cl.$^4$ .............................................. H05K 3/28
[52] U.S. Cl. .................................... 427/96; 228/118; 427/259; 427/421; 427/424
[58] Field of Search ............... 427/96, 259, 287, 424, 427/256, 421; 228/118; 118/302, 323, 697, 698; 346/140 IJ, 140 PD, 140 R, 75

[56] References Cited

U.S. PATENT DOCUMENTS

| | | | |
|---|---|---|---|
| 3,298,030 | 1/1967 | Lewis | 156/659.1 |
| 4,070,506 | 1/1978 | Meister | 427/156 |
| 4,296,418 | 10/1981 | Yamazaki et al. | 346/75 |
| 4,301,189 | 11/1981 | Arai et al. | 427/96 |
| 4,367,479 | 1/1983 | Bower | 346/140 R |

FOREIGN PATENT DOCUMENTS

| | | | |
|---|---|---|---|
| 2519160 | 9/1976 | Fed. Rep. of Germany | 346/140 PD |
| 3047884 | 7/1982 | Fed. Rep. of Germany | 427/96 |

Primary Examiner—John D. Smith
Attorney, Agent, or Firm—Fidelman, Wolffe & Waldron

[57] ABSTRACT

In accordance with one embodiment of the invention, solder masking material is pressurized by means of a fluid pump to approximately 250 psi and a high speed valve is used to turn the flow on and off rapidly in order that small "shots" of fluid are propelled from a tip, through the air, to selected portions of a circuit board. The selected areas of the circuit board to be masked are situated oppositely from the tip, as by a XY positioning system for the tip and/or the circuit board. The drops of masking material, which form upon impinging of the shots onto the circuit board, may be varied in volume and diameter. Where needed, a continuous bead of masking material may be formed on the circuit board by spacing the dots sufficiently close together.

14 Claims, 12 Drawing Figures

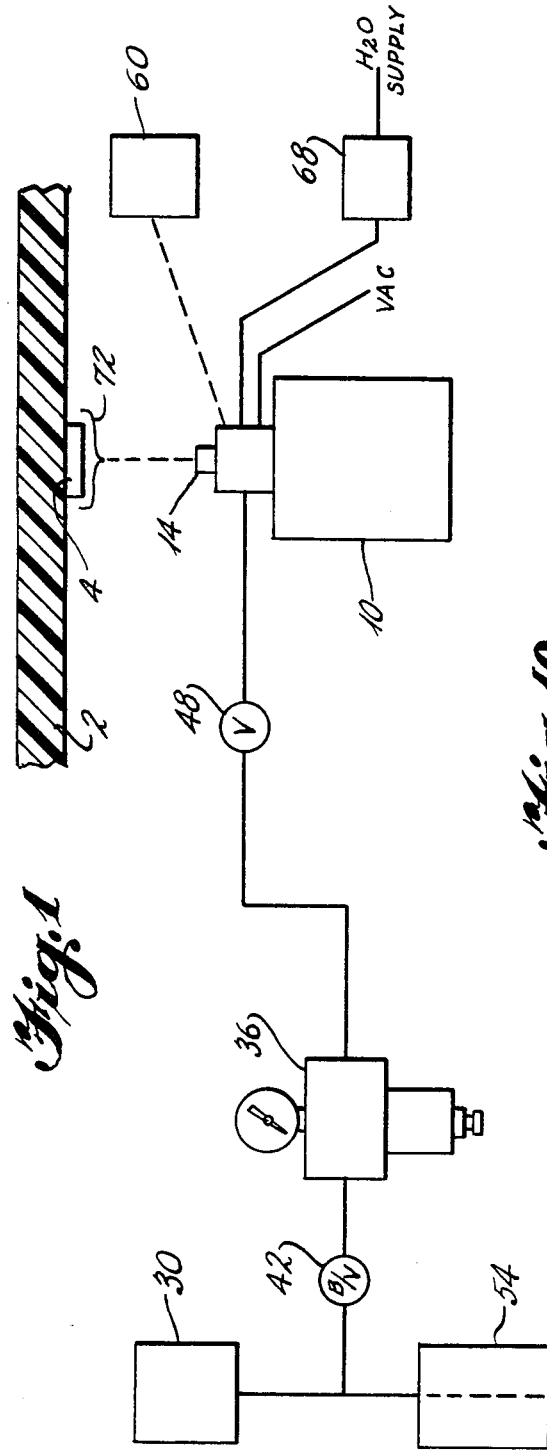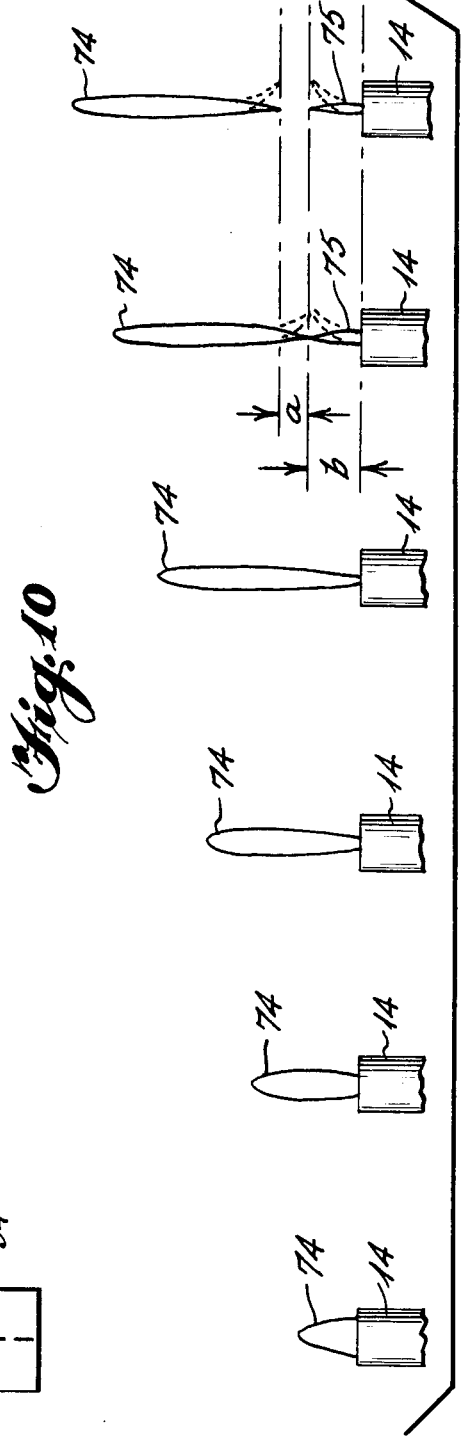

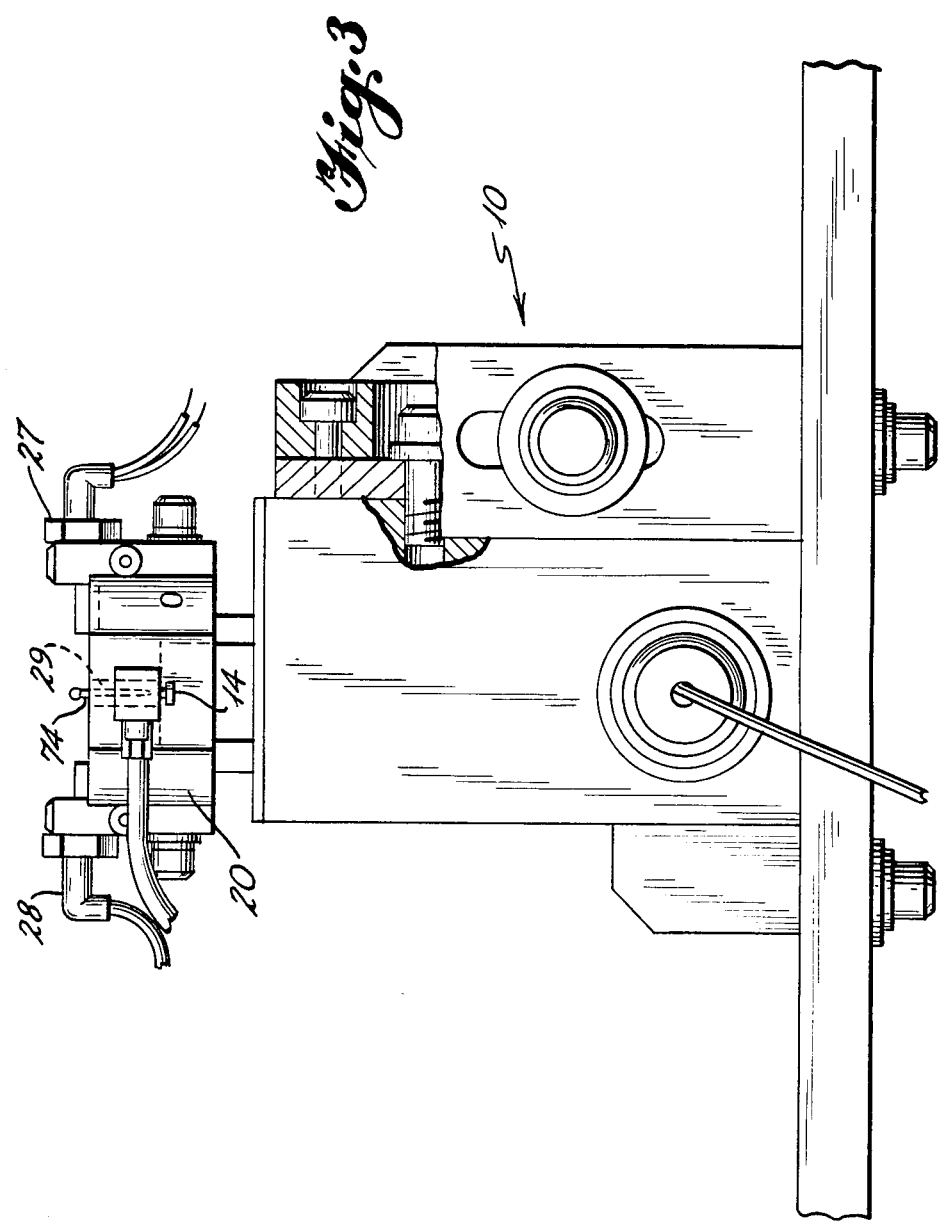

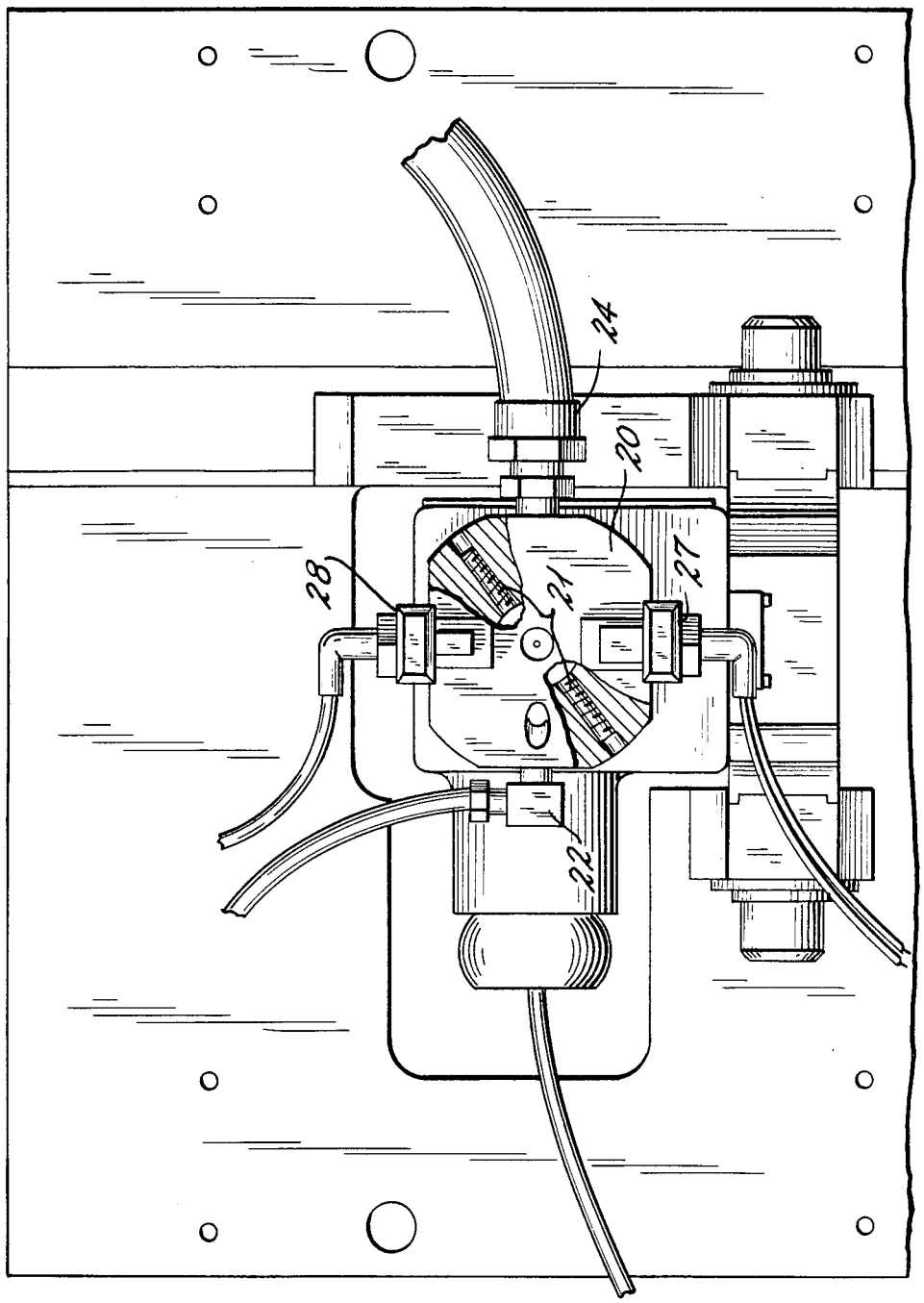

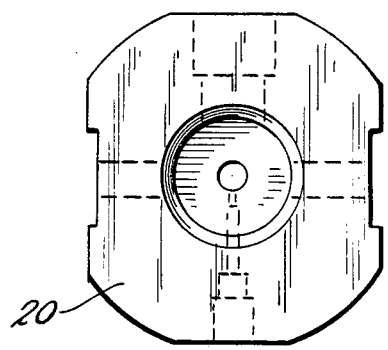
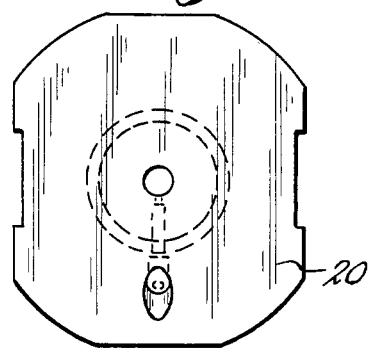
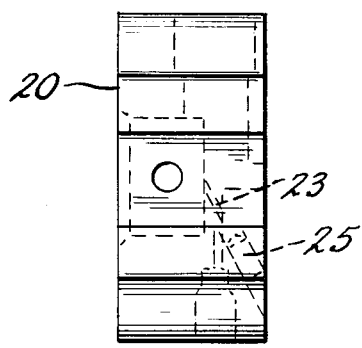
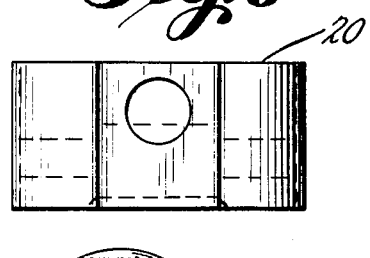
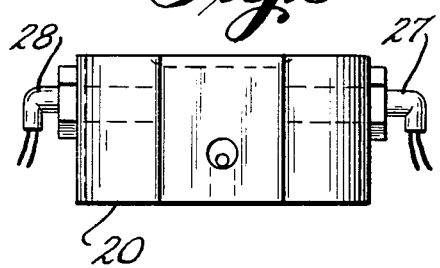
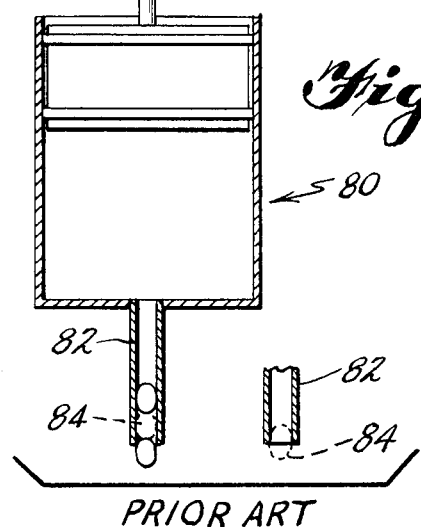

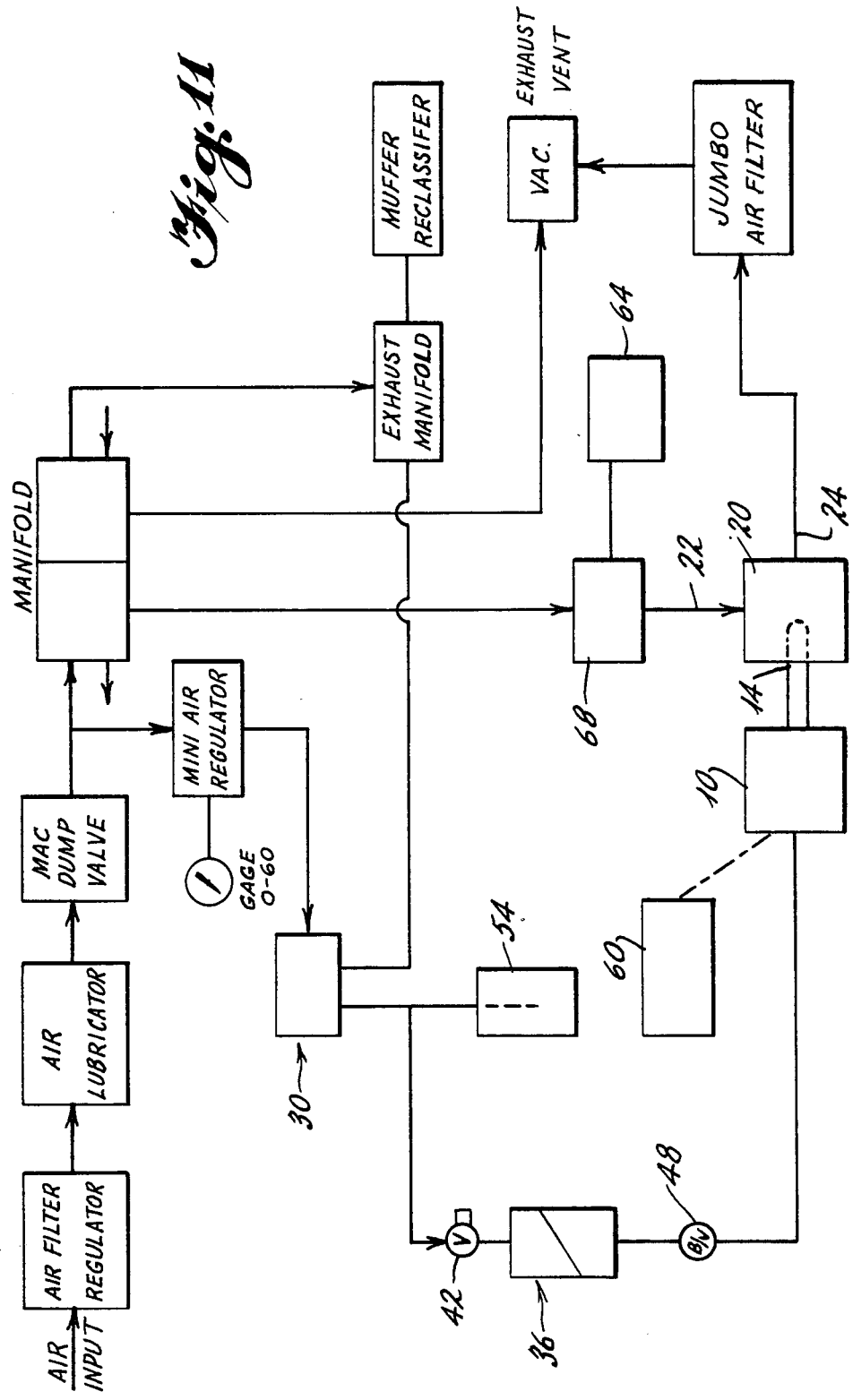

METHOD AND APPARATUS FOR APPLYING SOLDER MASKING TO A CIRCUIT BOARD

CROSS-REFERENCES TO PRIOR ART

| U.S. Pat. No. | Title | Inventor |
|---|---|---|
| 3,053,215 | APPARATUS FOR SOLDERING PRINTED SHEETS | Guty |
| 3,773,242 | WAVE SOLDERING APPARTUS HAVING UNOBSTRUCTED WORK PIECE PATH | Fitzsimmons |
| 4,059,708 | METHOD FOR SELECTIVE ENCAPSULATION | Heiss, Jr., et al. |
| 4,064,287 | PROCESS FOR TREATING SELECTED AREAS OF A SURFACE WITH SOLDER | Lipson, et al. |
| 4,084,022 | METHOD FOR TIN PLATING PRINTED BOARDS | Tratz, et al. |
| 4,139,143 | WAVE SOLDER MACHINE | Gumprecht |
| 4,230,793 | PROCESS FOR THE PRODUCTION OF SOLDER MASKS FOR PRINTED CIRCUITS | Losert, et al. |
| 4,246,147 | SCREENABLE AND STRIPPABLE SOLDER MASK AND USE THEREOF | Bakos, et al. |
| 4,301,189 | METHOD FOR APPLYING A SOLDER RESIST INK TO A PRINTED WIRING BOARD | Arai, et al. |
| 4,360,968 | METHOD FOR REDUCING SOLDER STICKING ON A PRINTED WIRING BOARD | D'Amico, et al. |
| 4,373,655 | COMPONENT MASK FOR PRINTED CIRCUIT BOARDS AND METHOD OF USE THEREOF | McKenzie, Jr. |

BACKGROUND OF THE INVENTION

The invention is directed to a method and apparatus for coating selected portions of a printed circuit board with a solder resist material in order to mask those portions from subsequently applied solder. After wave soldering or the like, an aqueous cleaner is used to clean the soldering resin and the solder masking material from the circuit board.

It is known to contact selected portions of a circuit board with the needle of a pressurized syringe or pot in order to apply a solder resist material thereto. The above cross-referenced U.S. Pat. No. 4,059,708, discloses the use of a hypodermic syringe in applying masking drops to a substrate, although not disclosing solder masking.

U.S. Pat. No. 3,053,215 discloses the use of liquid wax as a solder resist material which is sprayed onto a circuit board as it is being conveyed to a solder bath.

U.S. Pat. No. 4,230,793 discloses applying an ultraviolet light curable liquid photopolymer in a free falling curtain of material onto the top of a circuit board being conveyed, irradiating and curing portions of the photopolymer which are not to be soldered, and the subsquent developing of the cured layer with an agent which dissolves the unirradiated areas.

U.S. Pat. No. 4,373,655 discloses the concept of inserting mechanical devices into holes of a circuit board prior to subjecting the circuit board to wave soldering or the like.

U.S. Pat. Nos. 4,246,147 and 4,301,189 relate to masking selected portions of a circuit board by a screen printing process.

It is an object of the instant invention to provide a method and apparatus for selectively coating portions of a circuit board with a solder resist material wherein the resist material is projected through the air from a gun tip to selected portions of the circuit board, thus obviating the need for contacting the circuit board with the applicator.

It is a further object of this invention to project shots of a masking material onto selected portions of the circuit board wherein relative positioning between the projector and the circuit board and/or the amount of material projected onto the circuit board is programmably controllable and variable, thus obviating the need for a screen as in screen printing and for the changing of screens in order to vary masking of selected portions of the circuit board.

Still further, it is an object of this invention to alleviate the prior art problems of air entrapment in the solder masking material. By applying a relatively high pressure to the material, any air entrapped in the material is dispersed throughout the material for an homogeneity thereof. In practicing the invention, large air bubbles do not form in the tip of the dispensing gun and there is a consistent density ratio of air to solder masking material.

It is an additional object of this invention to obviate the sometimes lengthy process of running a vacuum on the masking material in an attempt to degas or remove entrapped air therefrom, since such degasing or deaerating is only 80% efficient.

It is another object of the instant invention to detect proper projection of solder masking material from a high speed valving gun, and for cleaning the tip of the gun upon clogging thereof.

Additionally, it is an object of the invention to ensure proper projection of shots of the solder masking material onto the circuit board by shielding ambient air currents from the general area of the projector at which consecutive shots of material are separated.

In accordance with one embodiment of the invention, the solder masking material is pressurized by means of a fluid pump and a regulator to approximately 250 psi, and a high speed valve is used to turn the flow on and off rapidly in order that small "shots" of fluid are propelled from a tip, through the air, to selected portions of a circuit board. The selected areas of the circuit board to be masked are situated oppositely from the tip, as by an X-Y positioning system for the tip and/or the circuit board. The drops of masking material, which form upon impinging of the shots onto the circuit board, may be varied in volume and diameter. Where needed, a continous bead of masking material may be formed on the circuit board by spacing the dots sufficiently close together.

BRIEF DESCRIPTION OF THE DRAWINGS

FIG. 1 is a schematic generally illustrating the apparatus and use of the device of the instant invention, with the circuit board and land thereof enlarged for clarity.

FIG. 3 is a left side elevation of the device of FIG. 2.

FIG. 4 is a top plan view of the device of FIG. 2.

FIG. 5 is a plan view of the tip housing assembly as viewed in FIG. 4, with parts thereof removed for clarity.

FIG. 6 is a left-side elevation of the device of FIG. 5.

FIG. 7 is a right-side elevation of the device of FIG. 5.

FIG. 8 is a top plan view of the device of FIG. 5.

FIG. 9 is a bottom plan of the device of FIG. 5.

FIG. 10 is a schematic illustrating sequential formation of a shot of the soldering material at the tip of the gun.

FIG. 11 is a block diagram illustrating the overall system.

FIG. 12 is a schematic illustrating a problem of the prior art.

DETAILED DESCRIPTION OF THE INVENTION

Figure 2:
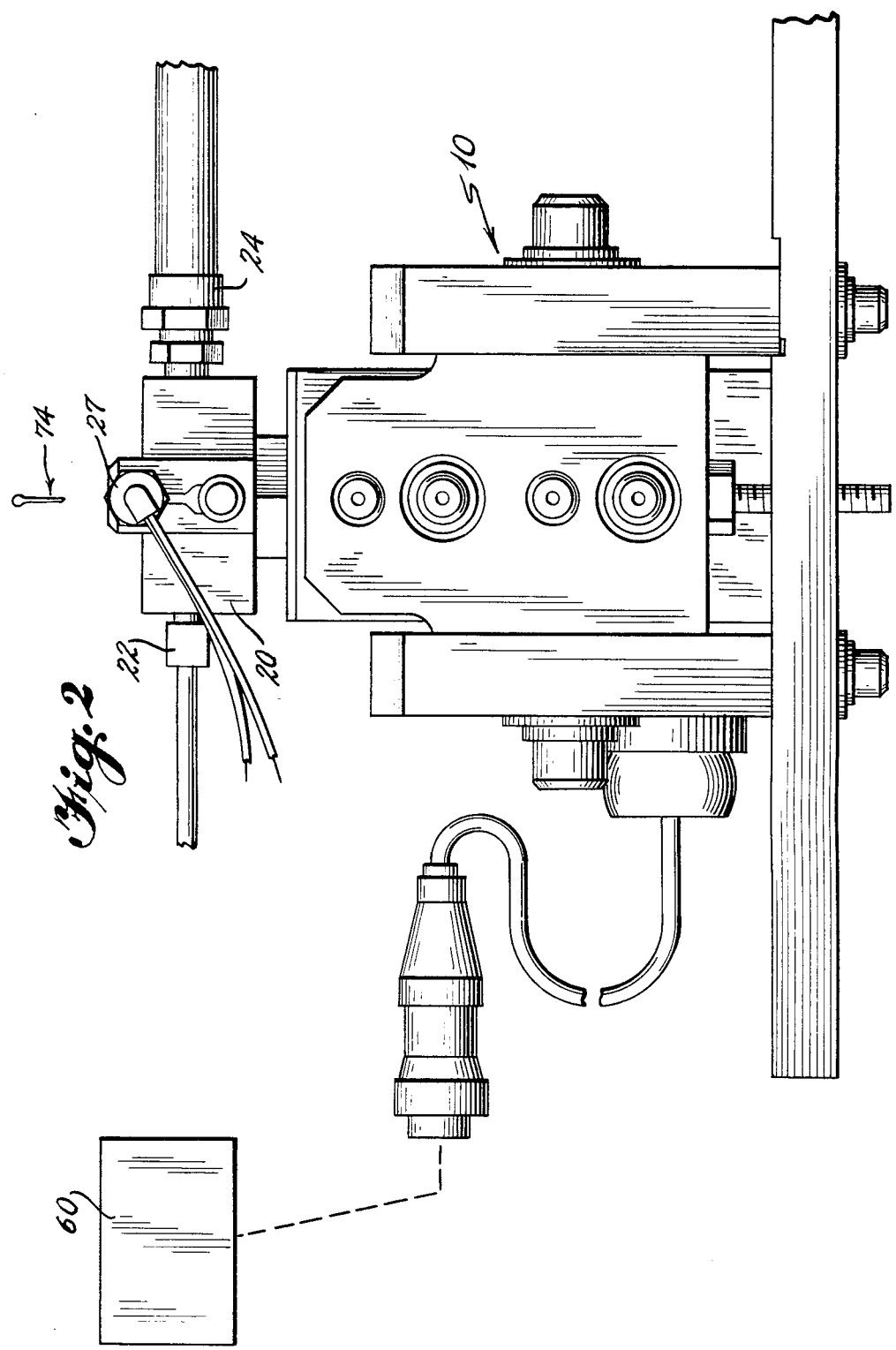
FIG. 2 is a front elevation of the solder mask gun with a tip housing assembly.

Referring to FIGS. 1 and 11 for a general description of the overall system, solder resist material is pumped from a supply 54 via fluid pump 30 through a gauged fluid regulator 36 to a gun assembly 10, from which it is projected onto the underside of a circuit board 2. Circuit board 2, is intermittently or continuously conveyed to a wave soldering machine (not shown) over the top of gun assembly 10 such that solder resist material 72 may be applied to lands 4 of circuit board 2.

In a prototype of the system, fluid pump 30 was manufactured by the ARO Corporation as Model 650–060. This fluid pump provides pressures of approximately 1120–1400 psig on the fluid supply line prior to fluid regulator 36. As may be seen from FIG. 11, a bleeder valve 42 is included in the line between the fluid supply 54 and regulator 36, the purpose of which is to allow purging of air from the line upon changing supplies.

Fluid pressure regulator 36 reduces the pressure to approximately 300 psig for application to the solenoid-actuated gun 10. As seen in FIG. 11, a ball valve 48 is provided in the line between pressure regulator 36 and gun 10 so that gun 10 may be replaced or repaired without loss of pressure on the overall system when ball valve 48 is closed. In practice, gun 10 may be a modified version of ARO Model No. DFQ 2068 AI, in which the tip has been changed, the control of the solenoid has been altered and a self-cleaning tip housing 20 has been added. By means of a programmable controller 60, actuation of the gun 10 and timing of the shots of resist material may be varied.

Referring to FIGS. 2–9, a tip housing assembly 20 has been added to gun 10 and surrounds tip 14 thereof. Tip housing assembly 20 performs several functions, one of which is to aid in cleaning unwanted material from tip 14. For instance, with the system shut down for a period of time, the solder resist material may congeal somewhat on the tip 14 of gun 10 and restrict it for subsequent operation. A typical solder resist material used with the invention is manufactured by Techform Laboratories, Inc. and is referred to as TC-564-40-105, a material which is water soluble in cold or hot water. In order to clean a congealed glob of material from tip 14, housing assembly 20 has a water input line at 22 communicating with an angled port 23 (best seen in FIG. 7) for directing the water onto tip 14. A vacuum line 24 is also connected to housing assembly 20 such that, upon purging resist material from tip 14 by directing water thereon, the water and the material being removed is evacuated from housing assembly 20 by vacuum line 24. As seen in FIG. 4, set screws 21 are provided for securement of housing assembly 20 to gun 10, as by attachment to a nozzle having tip 14.

Referring again to FIGS. 2–4, an optical detection system is incorporated into housing assembly 20 for detecting proper projection of the shots of material from tip 14. The optical system comprises a transmitter 28 and receiver 27 operated in timed relation with the opening and closing of the solenoid operated valve of gun 10 so that, upon actuating the valved orifice of tip 14 to allow a shot 74 of material to be projected therefrom, the optical system will be actuated to detect whether shot 74 passed therethrough by temporarily interrupting a light beam. Two particular defects during operation of the system are detectable with such an arrangement. If no shot 74 of solder resist material is projected from the gun, then the light beam of the optical system 27, 28 will not be broken within a certain period of time after actuation thereof. In this event, tip 14 will be purged by the application of water and vacuum, according to the programmed control. Additionally, in the instance where a glob of material may drop from the circuit board onto orifice 29 of housing assembly 20, the light beam would be continuously interrupted causing shut down of the system and notification of an operator, also according to programmed control.

Tip housing assembly 20 also serves the function of protecting tip 14 from ambient air currents which can cause incorrect projection of shot 74. For instance, FIG. 10 illustrates a sequence of formation of one shot 74 from tip 14. As may be seen from the last two steps of the sequence, shot 74 comprises a main portion and a trailing, tapered portion. A portion of resist material 75 remains attached to tip 14 during projection of each shot 74 therefrom, with remaining portion 75 tapered to an upper point which is substantially a mirror image of the tapered, trailing portion of shot 74. Without housing assembly 20, difficulties were encountered in projecting uniform shots of material onto the circuit board, and it was discovered by high speed video taping that ambient air currents near the tip 14 of gun 10 can and do cause the tapered portions of shot 74 and remaining portion 75 to be displaced (as seen in phantom lines in FIG. 10). Such a displacement of these tapered portions, particularly the tapered, trailing portion of shot 74 can and does result in faulty application of a dot 72 of resist material to a particular location of the circuit board 2. For instance, the tapered trailing portion of shot 74 upon engagement with the circuit board, may form a non-uniform dot of material so as to mask a portion of the circuit board which should be subjected to solder during a subsequent soldering operation. Accordingly, housing assembly 20 was developed to eliminate this problem by shielding tip 14 from the ambient air currents which cause such problems. Again referring to FIG. 10, shot 74 separates from remaining portion 75 at a distance "b" from tip 14 (which depends upon the diameter of the tip orifice, the speed with which the orifice is opened and closed, the pressure on the material supplied to the gun, and the viscosity of the material being used). With the above-referenced solder resist material, a presssure on the material of 285 psig, an orifice diameter of 0.0135 inches, and a valve actuation speed of 3.25 milliseconds, distance "b" was found to be 0.200 inches. Further, in order to completely alleviate any problems associated with ambient air currents, housing 20 was designed to shield the shot for an additional distance "a" above the point of separation. In the particular example given, distance "a" was equal to 0.100 inches, so that shot 74 was shielded for a total distance of 0.300 inches after leaving tip 14.

In practice, the circuit boards 2 were transported above gun assembly 10 on their way to a wave soldering tank (not shown), with the spacing between tip 14 and the bottom of circuit board ranging between $\frac{3}{4}$-$1\frac{1}{4}$ inches. By providing intermittent relative movement between circuit board 2 and gun 10 and by adjusting the increments of movement, it is possible to space the dots 72 of material sufficiently close together such that a bead of material may be formed to protect a strip of the circuit board from subsequent solder application.

As an example of a prior art problem which has been overcome by the instant invention, the reader's attention is directed to FIG. 12 wherein a syringe or dash pot 80 contains solder resist materal under a much lower pressure than that of the instant invention so that rather large air bubbles may form in the syringe 80 and cause a blockage in the needle 82 thereof. Such an air bubble 84 may occupy sufficient space between consecutive dots of resist material so that a misapplication of the resist material will be made, either by manual or mechanical means. Typically, prior art dispensers are operated with the material at a pressure of 20–30 pounds per square inch, such that air bubbles which block a needle commonly occur. The instant invention, by using at least ten times more pressure, overcomes the problem of air bubbles large enough to cause improper projection. The increased pressure also allows accurate shot projections.

Having described the invention, it will be seen that the objects set forth above, among those made apparent from the preceding description, are efficiently obtained and, since certain changes may be made in carrying out the above method and in the construction set forth without departing from the scope of the invention, it is intended that all matter contained in the above description or shown in the accompanying drawings shall be interpreted as illustrative and not in a limiting sense. For instance, projection of the resist material may be in other directions than upwardly.

It is also to be understood that the following claims are intended to cover all of the generic and specific features of the invention hereindescribed, and all statements of the scope of the invention, which as a matter of language, might be said to fall therebetween.

Now that the invention has been described what is claimed as new and desired to be secured by Letters Patent is:

1. A method of applying temporary viscous solder resist material to a circuit board and masking selected portions thereof from subsequent solder applying, and comprising the steps of:
   providing a gun for projecting shots of said resist material from a tip of said gun;
   positioning said tip and circuit board relative to and spaced from each other such that said tip is generally oppositely spaced from a selected portion of said circuit board; and
   projecting a shot of said resist material onto said selected portion and masking said selected portion from subsequently applied solder.

2. A method as in claim 1, and further comprising the steps of:
   repositioning said tip and circuit board relative to and spaced from each other such that said tip is generally oppositely spaced from another selected portion of said circuit board; and
   projecting another shot of said resist material onto said other selected portion and masking said other selected portion from subsequently applied solder.

3. A method as in claim 2, and further comprising the step of:
   varying an amount of said resist material projected onto each selected portion of said circuit board according to a size of each selected portion.

4. A method as in claim 3, and further comprising:
   varying an amount of said resist material per said shot to effect masking of said selected portion.

5. A method as in claim 1, and further comprising the step of:
   forming a dot of said resist material on each of said selected portions to effect said masking.

6. A method as in claim 5, and further comprising:
   varying an amount of said resist material for each shot and a diameter of each corresponding dot.

7. A method as in claim 5, and further comprising:
   projecting a plurality of said shots onto said selected portion; and
   spacing plural dots of said resist material, corresponding to said plurality of shots, sufficiently close together to form a continuous bead of said resist material.

8. A method as in claim 1, and further comprising the steps of:
   purging said tip of unwanted material.

9. A method as in claim 8, wherein said purging comprises:
   applying a vacuum across said tip; and
   directing a liquid, with which said material is soluble, onto said tip to effect cleaning of unwanted material therefrom;
   wherein said vacuum evacuates said liquid and said unwanted material from said tip.

10. A method as in claim 1, wherein each of said shots of resist material comprises a main portion and a trailing portion, said trailing portion separating from a remaining portion of said material which is still attached to said tip during said projecting such that said trailing and remaining portions taper to a common point of attachment at which said separating occurs and further comprising the step of:
    shielding at least part of said shot, during said projecting, for a sufficient distance extending from said tip and, by said shielding, preventing distortion of said trailing portion generally at said point due to ambient air currents so as to properly project said shot from said gun.

11. A method as in claim 1 and further comprising the step of:
    detecting the presence and absence of shots of said resist material leaving said tip during said projecting.

12. A method of applying temporary solder resist material to a circuit board and masking selected portions thereof from subsequent solder applying, and comprising the steps of:
    providing a gun for projecting shots of said resist material from a tip of said gun;
    positioning said tip and circuit board relative to and spaced from each other such that said tip is generally oppositely spaced from a selected portion of said circuit board;
    projecting a shot of said resist material onto said selected portion and masking said selected portion from subsequently applied solder;

applying a vacuum across said tip; and directing a liquid, with which said material is soluble, onto said tip to effect cleaning of unwanted material therefrom;

wherein said vacuum evacuates said liquid and unwanted material from said tip to effect purging thereof.

13. A method of applying temporary solder resist material to a circuit board and masking selected portions thereof from subsequent solder applying, and comprising the steps of:

providing a gun for projecting shots of said resist material from a tip of said gun, each of said shots of resist material comprising a main portion and a trailing portion, said trailing portion separating from a remaining portion of said material which is still attached to said tip during said projecting such that said trailing and remaining portions taper to a common point of attachment at which said separating occurs;

positioning said tip and circuit board relative to and spaced from each other such that said tip is generally oppositely spaced from a selected portion of said circuit board;

projecting a shot of said resist material onto said selected portion and masking said selected portion from subsequently applied solder; and shielding at least part of said shot, during said projecting, for a sufficient distance extending from said tip and, by said shielding, preventing distortion of said trailing portion generally at said point due to ambient air currents so as to properly project said shot from said gun.

14. A method of applying temporary solder resist material to a circuit board and masking selected portions thereof from subsequent solder applying, and comprising the steps of:

providing a gun for projecting shots of said resist material from a tip of said gun;

positioning said tip and circuit board relative to and spaced from each other such that said tip is generally oppositely spaced from a selected portion of said circuit board;

projecting a shot of said resist material onto said selected portion and masking said selected portion from subsequently applied solder; and detecting the presence and absence of shots of said resist material leaving said tip during said projecting.

* * * * *